(12) United States Patent
Lei (10) Patent No.: US 12,309,967 B2
(45) Date of Patent: May 20, 2025

(54) ELECTRONIC DEVICE INCLUDING ACCOMMODATION CAVITY AND FLOW CHANNEL IN HOUSING

(71) Applicant: Lenovo (Beijing) Limited, Beijing (CN)

(72) Inventor: Na Lei, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 89 days.

(21) Appl. No.: 17/691,047

(22) Filed: Mar. 9, 2022

(65) Prior Publication Data

US 2023/0044636 A1 Feb. 9, 2023

(30) Foreign Application Priority Data

Aug. 3, 2021 (CN) .......................... 202110885533.2

(51) Int. Cl.
*H05K 7/20* (2006.01)
*G06F 1/20* (2006.01)

(52) U.S. Cl.
CPC ......... *H05K 7/20254* (2013.01); *G06F 1/203* (2013.01); *H05K 7/20272* (2013.01)

(58) Field of Classification Search
CPC .. H05K 7/20; H05K 7/20136; H05K 7/20163; H05K 7/20218; H05K 7/20254; H05K 7/20272; H05K 7/2039; H05K 7/20436; H05K 7/20481; H05K 7/2049; H05K 7/20509; H05K 7/20954; H05K 7/20963; H05K 7/20972; H05K 7/20981; H01L 23/473; H01L 23/36; H01L 23/373; H01L 23/3736; G06F 1/20–203; F28D 15/02
See application file for complete search history.

(56) References Cited

U.S. PATENT DOCUMENTS

| | | | | |
|---|---|---|---|---|
| 10,428,257 | B2* | 10/2019 | Liu | .......................... C09K 15/24 |
| 10,504,812 | B1* | 12/2019 | You | ..................... H05K 7/20463 |
| 11,755,079 | B2* | 9/2023 | Chen | .......................... G06F 1/20 |
| | | | | 361/679.53 |
| 2006/0038285 | A1* | 2/2006 | Tokuhira | ............... H01L 23/473 |
| | | | | 257/E23.098 |
| 2018/0151930 | A1* | 5/2018 | Kim | ................... H01M 10/6554 |
| 2018/0213687 | A1* | 7/2018 | Lu | ....................... H05K 7/20254 |
| 2019/0072255 | A1* | 3/2019 | Kato | ..................... F21S 41/151 |
| 2019/0208665 | A1* | 7/2019 | Tsai | .................... H05K 7/20254 |
| 2020/0286858 | A1* | 9/2020 | Fricker | ............... H01L 23/5385 |

(Continued)

FOREIGN PATENT DOCUMENTS

| | | |
|---|---|---|
| CN | 206100683 U | 4/2017 |
| CN | 212367778 U | 1/2021 |

*Primary Examiner* — Zachary Pape
*Assistant Examiner* — Steven Ngo
(74) *Attorney, Agent, or Firm* — ANOVA LAW GROUP, PLLC (57) ABSTRACT

An electronic device includes a first housing and a second housing connected to the first housing. An accommodation cavity is formed between the first housing and the second housing. The electronic device further includes a heat generation member arranged in the accommodation cavity and a flow channel arranged in the first housing. The flow channel is configured to accommodate heat exchange liquid and dissipate heat for the heat generation member through the heat exchange liquid.

13 Claims, 6 Drawing Sheets

(56) References Cited

U.S. PATENT DOCUMENTS

| | | | |
|---|---|---|---|
| 2022/0192052 A1* | 6/2022 | Lo ........................ | H05K 7/2039 |
| 2022/0192090 A1* | 6/2022 | Roberts ................ | A01D 34/008 |
| 2022/0256737 A1* | 8/2022 | Huang ................. | H05K 7/2039 |
| 2022/0373275 A1* | 11/2022 | Mostafavi Yazdi ........................ H05K 7/20272 | |

* cited by examiner

ELECTRONIC DEVICE INCLUDING ACCOMMODATION CAVITY AND FLOW CHANNEL IN HOUSING

CROSS-REFERENCE TO RELATED APPLICATION

This application claims priority to Chinese Application No. 202110885533.2, filed on Aug. 3, 2021, the entire contents of which are incorporated herein by reference.

FIELD OF THE DISCLOSURE

The present disclosure generally relates to the field of electronic technology and, more particularly, to an electronic device.

BACKGROUND

Electronic devices are used frequently by people. Heat-generating components in electronic devices need heat dissipation to ensure reliable operation. Reasonable heat dissipation for heat-generating components is a problem to be solved at present.

SUMMARY

In accordance with the disclosure, there is provided an electronic device including a first housing and a second housing connected to the first housing. An accommodation cavity is formed between the first housing and the second housing. The electronic device further includes a heat generation member arranged in the accommodation cavity and a flow channel arranged in the first housing. The flow channel is configured to accommodate heat exchange liquid and dissipate heat for the heat generation member through the heat exchange liquid.

REFERENCE NUMERALS

Accommodation cavity 101; First housing 110; First flow channel 111; First plate body 112; Second plate body 113; Protrusion 114; Second flow channel 115; Inlet 116; Outlet 117; Elastic member 118; Second housing 120; Heat generation member 130; First driver mechanism 140; and Fan assembly 150.

DETAILED DESCRIPTION OF THE EMBODIMENTS

In order to provide a clear illustration of the present disclosure, embodiments of the present disclosure are described with reference to the drawings.

As used herein, the terms "mounted," "coupled," and "connected" should be interpreted broadly, unless there are other clear and specific limitations. For example, the connection may also be an electrical connection or a mutual communication connection. Furthermore, the connection may be a direct connection or an indirect connection via an intermedium. Those skilled in the art can understand the specific meanings of the terms described above according to the specific situations.

The terms "first," "second," "third," or the like in the disclosure are merely for distinguishing similar elements, and are not intended to indicate or imply the sequence of the corresponding elements. Thus, elements associated with "first," "second," and "third" may be interchangeable under appropriate circumstances. The embodiments of the disclosure may be implemented in sequences other than those illustrated or described herein.

Figure 6:
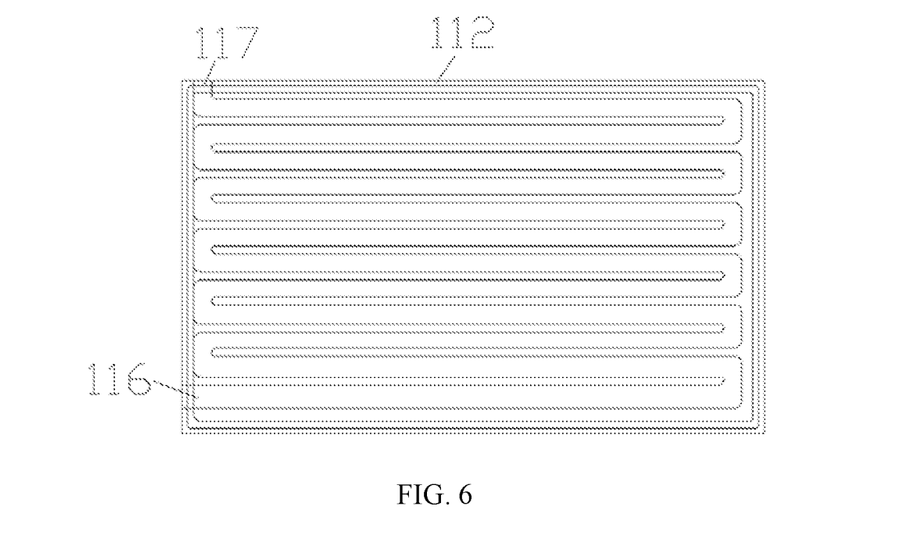
FIG. 6 is a schematic structural diagram of a first plate body of an electronic device according to an embodiment of the disclosure.
Figure 7:
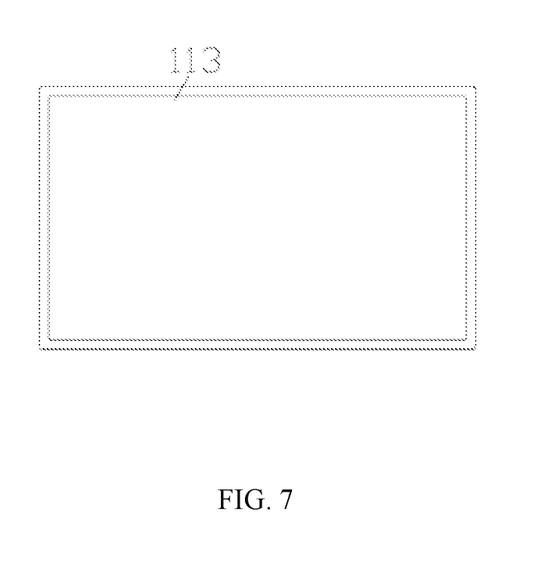
FIG. 7 is a schematic structural diagram of a second plate body of an electronic device according to an embodiment of the disclosure.
Figure 8:
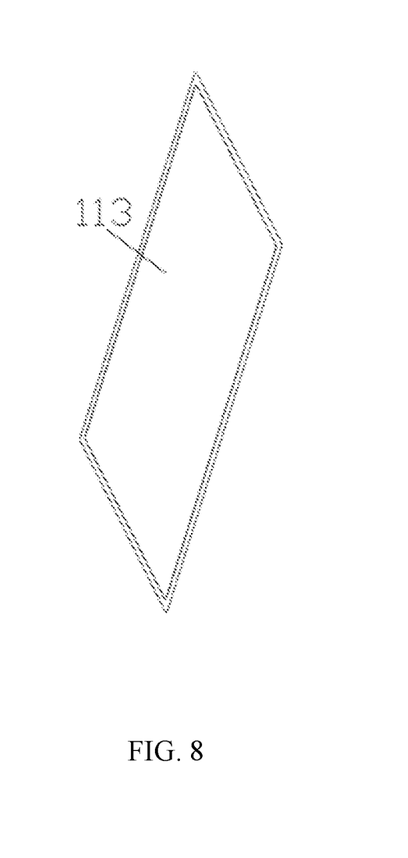
FIG. 8 is a schematic structural diagram of another second plate body of an electronic device according to an embodiment of the disclosure.
Figure 9:
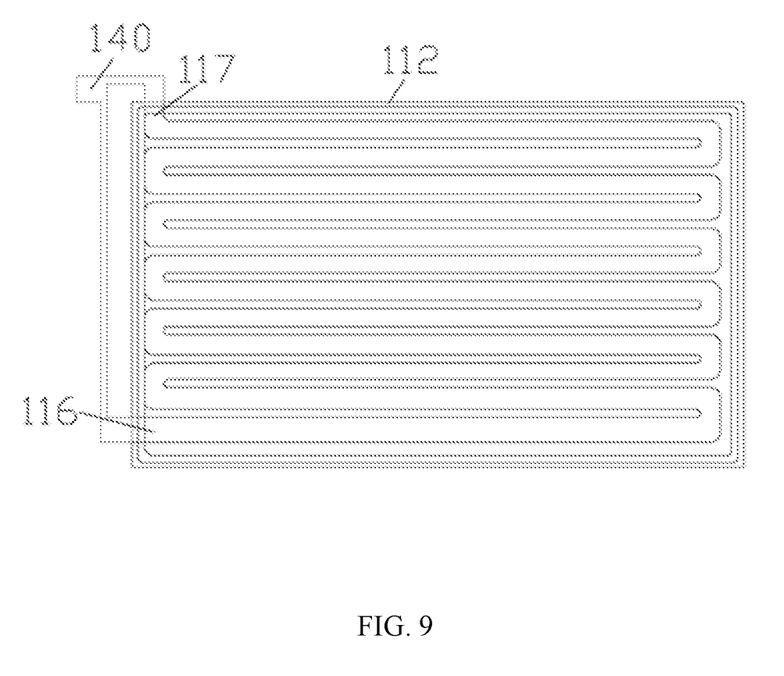
FIG. 9 is a partial structural diagram of an electronic device according to an embodiment of the disclosure.
Figure 10:
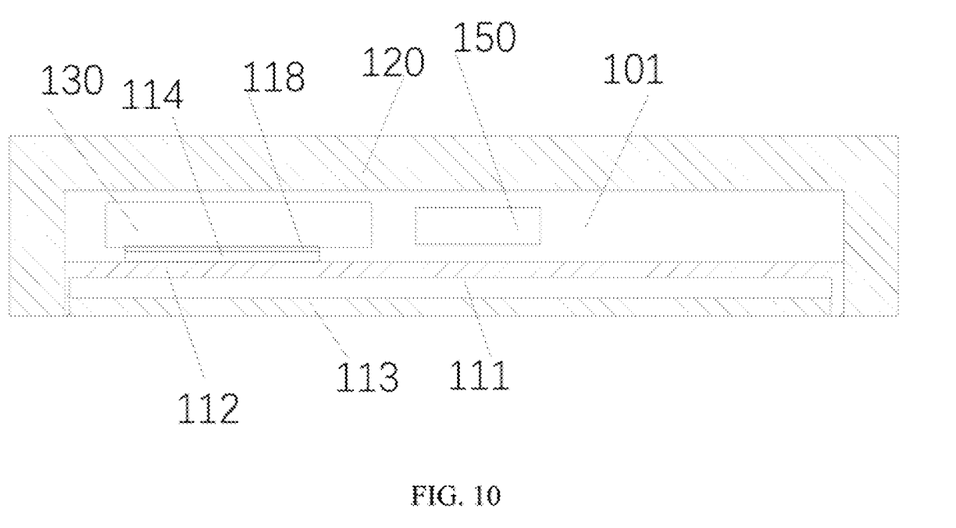
FIG. 10 is a schematic structural sectional view of another electronic device according to an embodiment of the disclosure.

Unless conflict exists, embodiments and features described in embodiments of the disclosure can be combined. FIGS. 1 to 5 are schematic structural sectional views of an electronic device consistent with the disclosure. FIG. 6 is a schematic structural diagram of a first plate body of the electronic device consistent with the disclosure. FIGS. 7 and 8 are schematic structural diagrams of a second plate body of the electronic device consistent with embodiment of the disclosure. FIG. 9 is a partial structural diagram of the electronic device consistent with the embodiment of the disclosure. Hereinafter, electronic devices consistent with the disclosure will be described with reference to FIGS. 1 to 9.

As shown in FIGS. 1 to 5, the electronic device includes a first housing 110, a second housing 120, a heat generation member 130, and a first flow channel 111. The second housing 120 is configured to be connected to the first housing 110. An accommodation cavity 101 is formed between the first housing 110 and the second housing 120. The heat generation member 130 is arranged in the accommodation cavity 101. The first flow channel 111 is arranged in the first housing 110. The first flow channel 111 can be configured to accommodate heat exchange liquid, and dissipate heat for the heat generation member 130 through the flowing heat exchange liquid. Since the first flow channel 111 is arranged in the first housing 110, a heat dissipation structure of the electronic device can be greatly reduced. The first housing 110 can serve as both the housing of the electronic device and the heat dissipation structure of the electronic device, which can greatly simplify the structure of the electronic device. Since the first housing 110 is the housing of the electronic device, a plurality of first flow channels 111 can be arranged in the first housing 110, thereby greatly increasing a volume of the first flow channel 111.

The structure of the electronic device is not limited herein. For example, the electronic device may include a tablet, and the first housing 110 and the second housing 120 can form a body of the tablet. As another example, the electronic device can include a laptop, and the first housing 110 and the second housing 120 can form a body where a keyboard of the laptop is located. As another example, the electronic device can include a mobile phone, and the first housing 110 and the second housing 120 can form a body of the mobile phone.

The structure of the first housing 110 is not limited herein. For example, the first housing 110 can be configured to abut against a bearing surface to support the electronic device. In some embodiments, the first housing 110 and the second housing 120 can form a body on a side of the electronic device abutting against the bearing surface. The first housing 110 can face the bearing surface. The bearing surface is a surface supporting the electronic device. The bearing surface can be a desktop or a ground.

As another example, when the electronic device includes the tablet or the mobile phone, the first housing 110 can be a rear housing of the tablet or the mobile phone. For example, the first housing 110 can be a housing on a side of the tablet or mobile phone that is not provided with a display screen.

The structure of the second housing 120 is not limited herein, as long as the accommodation cavity 101 can be formed between the first housing 110 and the second housing 120. The accommodation cavity 101 can be configured to accommodate functional elements of the electronic device.

A manner in which the second housing 120 is connected to the first housing 110 is not limited herein. For example, the second housing 120 and the first housing 110 may be connected by screws. As another example, the second housing 120 and the first housing 110 may be connected by hooks.

The structure of the heat generation member 130 is not limited herein, as long as the heat generation member 130 can generate heat. For example, the heat generation member 130 may include a motherboard, a processor, a graphics card, or the like.

A shape of the first flow channel 111 is not limited herein, as long as the first flow channel 111 can accommodate the heat exchange liquid.

A power source for the heat exchange liquid to flow in the first flow channel 111 is not limited herein. For example, as shown in FIGS. 6 and 9, the first housing 110 has an inlet 116 and an outlet 117, and the inlet 116 and the outlet 117 communicate with the first flow channel 111, such that the heat exchange liquid can enter the first flow channel 111 from the inlet 116, and the heat exchange liquid in the first flow channel 111 can flow out from the outlet 117. As such, the heat exchange liquid in the first flow channel 111 can be in a flowing state. The heat exchange liquid flowing in the first flow channel 111 can take away more heat of the heat generation member 130, thereby greatly improving the heat dissipation capability of the electronic device.

Arrangement positions of the inlet 116 and the outlet 117 are not limited herein. For example, as shown in FIG. 9, the inlet 116 and the outlet 117 are arranged in the accommodation cavity 101. The electronic device further includes a first driver mechanism 140. The first driver mechanism 140 can be arranged in the accommodation cavity 101, the first driver mechanism 140 can communicate with the inlet 116 and the outlet 117. The first driver mechanism 140 can be configured to drive the heat exchange liquid to flow in the first flow channel 111. As such, the first driver mechanism 140 can drive the heat exchange liquid to flow in the first flow channel 111 to take away the heat of the heat generation member 130.

The structure of the first driver mechanism 140 is not limited herein. For example, the first driver mechanism 140 may include a first pump body.

As another example, the inlet 116 and the outlet 117 can be arranged at an outer surface of the first housing 110. Thus, the heat exchange liquid can be driven to flow in the first flow channel 111 by a second driver mechanism arranged outside the electronic device. Two driver mechanisms can communicate with the inlet 116 and the outlet 117. When the heat generated in the electronic device needs to be dissipated via the first flow channel 111, the second driver mechanism can be connected to the inlet 116 and the outlet 117. The second driver mechanism can be activated, and the heat exchange liquid can enter the first flow channel 111 from the inlet 116 under the driving of the second driver mechanism, and the heat exchange liquid entering the first flow channel 111 can flow out from the outlet 117. Since the second driver mechanism is a mechanism other than the electronic device, the volume of the electronic device can be greatly reduced.

The structure of the second driver mechanism is not limited herein. For example, the second driver mechanism may include a second pump body. In response to the inlet 116 and the outlet 117 not being communicated with the second driver mechanism, there may be no heat exchange liquid in the first flow channel 111. For example, the heat exchange liquid can be driven into the first flow channel 111 by the second driver mechanism, and when there is no need to dissipate the heat for the electronic device through the first flow channel 111, the second driver mechanism can drive the heat exchange liquid in the first flow channel 111 to the outside of the first flow channel 111.

A form of the heat exchange liquid is not limited herein. For example, the heat exchange liquid may include water.

Figure 1:
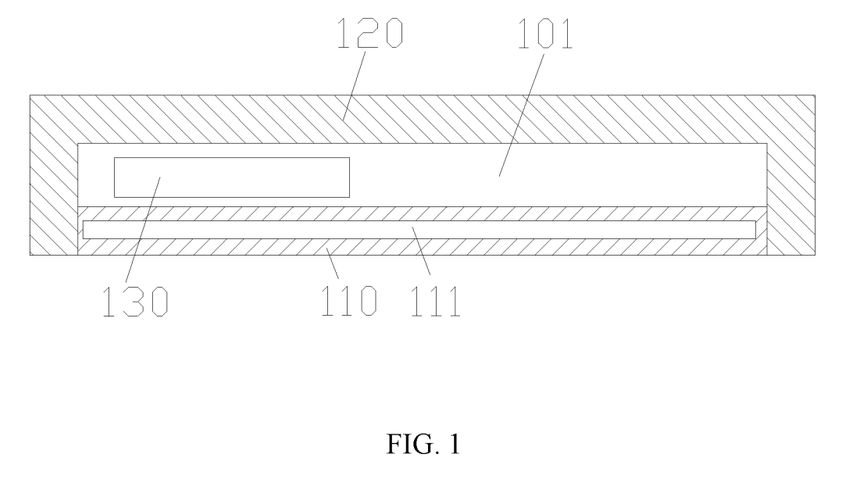
FIG. 1 is a schematic structural sectional view of an electronic device according to an embodiment of the disclosure.
Figure 2:
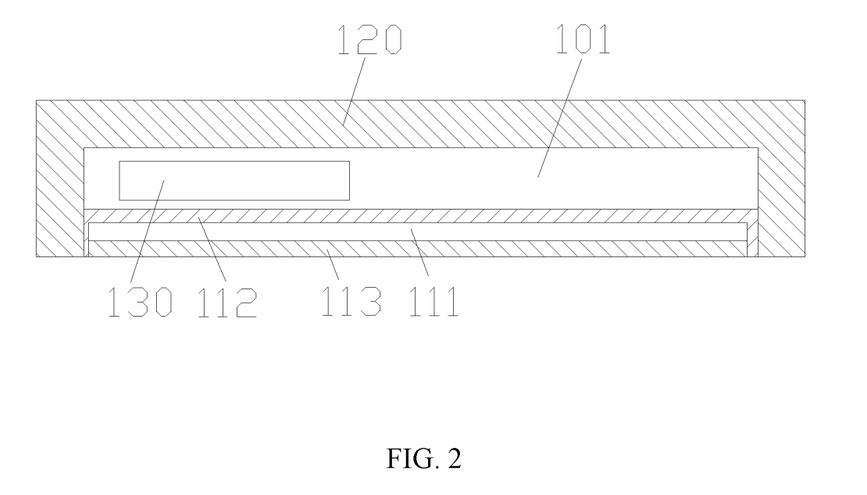
FIG. 2 is a schematic structural sectional view of another electronic device according to an embodiment of the disclosure.
Figure 3:
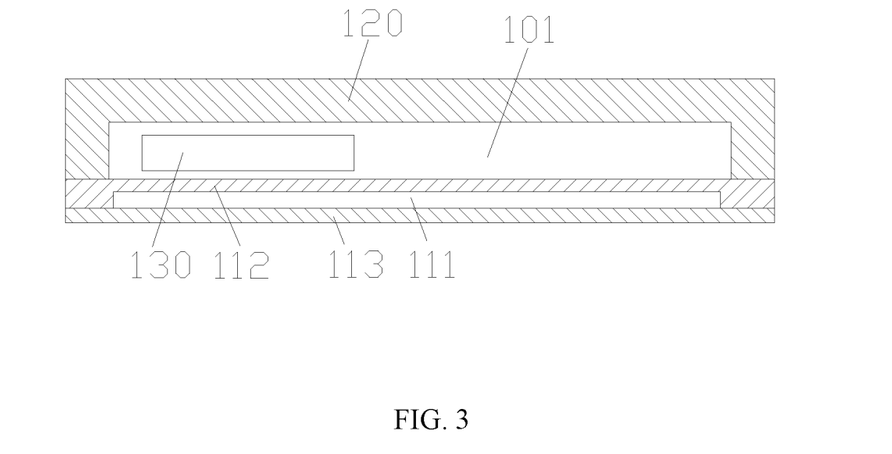
FIG. 3 is a schematic structural sectional view of another electronic device according to an embodiment of the disclosure.

In some embodiments, as shown in FIGS. 2 and 3, the first housing 110 may include a first plate body 112 and a second plate body 113. The first plate body 112 is arranged at a side proximal to the accommodation cavity 101, and the first flow channel 111 is arranged at a side of the first plate body 112 distal from the accommodation cavity 101. The second plate body 113 and the first plate body 112 are connected, the second plate body 113 is arranged at the side distal from the accommodation cavity 101, and the second plate body 113 covers the first flow channel 111. As such, the first housing 110 having the first flow channel 111 can be formed by the first plate body 112 and the second plate body 113. The first flow channel 111 is arranged at the side of the first plate body 112 distal from the accommodation cavity 101 and covers the first flow channel 111 by the second plate body 113, such that, the first flow channel 111 can be exposed on the first plate body 112, which is convenient for processing the first flow channel 111.

The structure of the first plate body 112 is not limited herein, as long as the surface of the first plate body 112 is provided with the first flow channel 111. For example, as shown in FIG. 2, the first plate body 112 has a bent plate-like structure. As another example, as shown in FIGS. 3 and 6, the first plate body 112 has a straight plate structure.

A material of the first plate body 112 is not limited herein. For example, the first plate body 112 may be made of a material conducting heat easily. For example, the material of the first plate body 112 may include copper, aluminum, or the like.

The structure of the second plate body 113 is not limited herein, as long as the second plate body 113 can cover the first flow channel 111. For example, as shown in FIGS. 7 and 8, the second plate body 113 has a straight plate structure.

A material of the second plate body 113 is not limited herein. For example, the second plate body 113 may be made of a material that does not conduct heat easily. For example, the material of the second plate body 113 may include steel.

The material of the second plate body 113 and the material of the first plate body 112 may be the same or different. For example, the thermal conductivity of the first plate body 112 can be greater than that of the second plate body 113, such that the first plate body 112 with better thermal conductivity can transfer the heat generated by the heat generation member 130 to the heat exchange liquid in the first flow channel 111 as soon as possible, and the second plate body 113 with poorer thermal conductivity can prevent the heat in the heat exchange liquid in the first flow channel 111 from being transferred to the surface of the second plate body 113. Since the second plate body 113 is located at an outer side of the electronic device, the second plate body 113 with poorer thermal conductivity can prevent the heat in the heat exchange liquid in the first flow channel 111 from being transferred to the surface of the electronic device, thereby preventing the surface of the electronic device from becoming too hot and improving the user experience of electronic device.

A manner in which the second plate body 113 is connected to the first plate body 112 is not limited herein. For example, the second plate body 113 is connected to the first plate body 112, such that the first plate body 112 and the second plate body 113 can form an integral structure. For example, the second plate body 113 and the first plate body 112 may be welded together to form the integral structure. As another example, the second plate body 113 and the first plate body 112 may be glued together to form the integral structure. The second plate body 113 and the first plate body 112 forming the integral structure can refer to that there is no gap between the second plate body 113 and the first plate body 112, and thus, the heat exchange liquid in the first flow channel 111 cannot flow out from between the second plate body 113 and the first plate body 112.

As shown in FIGS. 2 and 3, a connection portion between the first plate body 112 and the second plate body 113 extends from the first flow channel 111 to an outer surface of the first housing 110, thereby preventing the connection between the first plate body 112 and the second plate body 113 from being damaged, and the heat exchange liquid in the first flow channel 111 from flowing into the accommodation cavity 101. Since the connection portion between the first plate body 112 and the second plate body 113 extends from the first flow channel 111 to the outer surface of the first housing 110, in response to the connection between the first plate body 112 and the second plate body 113 being damaged, the heat exchange liquid in the first flow channel 111 can flow out of the electronic device from the connection portion between the first plate body 112 and the second plate body 113. As such, a heat dissipation safety of the electronic device can be greatly improved.

The connection portion between the first plate body 112 and the second plate body 113 can refer to a connection gap between the first plate body 112 and the second plate body 113.

In some embodiments, the first plate body 112 and the heat generation member 130 may be in a thermally conductive contact, or may have a gap therebetween. Thermally conductive contact may refer to a contact via a thermally conductive structure or a direct contact. The thermally conductive structure may include a structural member or a thermally conductive adhesive.

Figure 4:
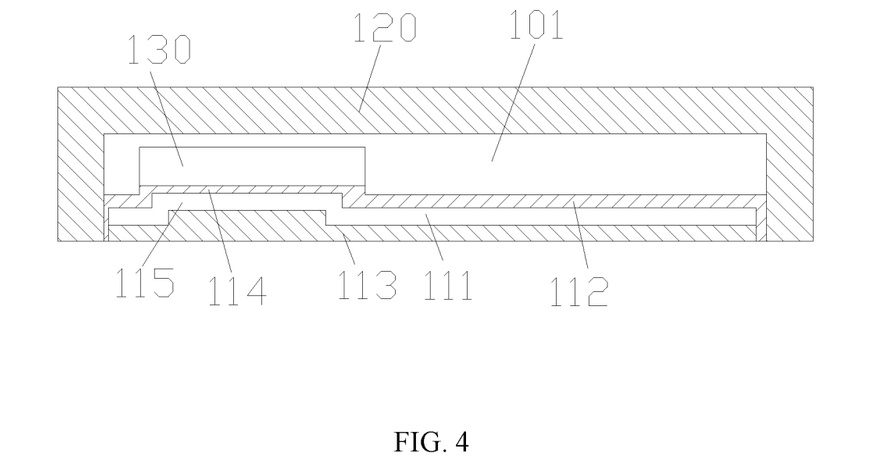
FIG. 4 is a schematic structural sectional view of another electronic device according to an embodiment of the disclosure.
Figure 5:
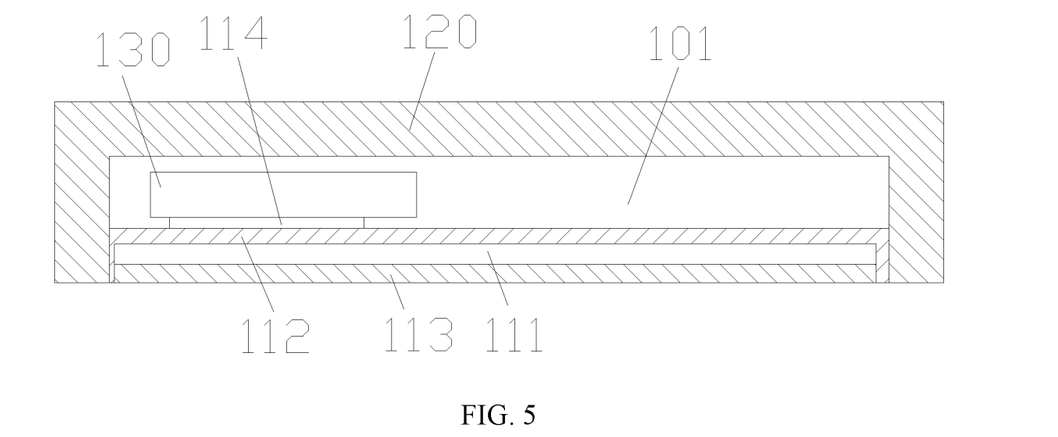
FIG. 5 is a schematic structural sectional view of another electronic device according to an embodiment of the disclosure.

For example, as shown in FIGS. 4 and 5, the first plate body 112 can include a protrusion 114, the protrusion 114 is arranged in the accommodation cavity 101, and the protrusion 114 can be in thermally conductive contact with the heat generation member 130. The heat generated by the heat generation member 130 can be quickly transferred to the first plate body 112 through the protrusion 114, and then transferred from the first plate body 112 to the heat exchange liquid in the first flow channel 111. Thus, the heat dissipation capability of the electronic device can be improved.

The structure of the protrusion 114 is not limited herein. In some embodiments, the protrusion 114 may have an integral structure with the first plate body 112, e.g., the protrusion 114 can be a part of the first plate body 112, and the protrusion 114 and the first plate body 112 can belong to the same structural member.

The protrusion 114 may have a solid structure. The protrusion 114 can alternatively have a hollow structure.

In some embodiments, as shown in FIG. 4, the protrusion 114 has a second flow channel 115, and the second flow channel 115 is configured to communicate with the first flow channel 111. The flowing heat exchange liquid can be closer to the heat generation member 130 via the second flow channel 115, such that the heat exchange liquid can take away the heat generated by the heat generation member 130 more quickly.

As another example, as shown in FIG. 5, the protrusion 114 and the first plate body 112 are different structural members. The protrusion 114 is connected to the first plate body 112. The protrusion 114 may have a solid structure. The material of the protrusion 114 is not limited herein. For example, the material of the protrusion 114 may include copper.

In some embodiments, the electronic device may further include an elastic member 118. The elastic member 118 can be arranged between the heat generation member 130 and the first plate body 112. The elastic member 118 can be configured to maintain a contact between the protrusion 114 and the heat generation member 130 via a deformation force. That is, there is a set contact pressure between the protrusion 114 and the heat generation member 130, such that the protrusion 114 and the heat generation member 130 can be attached more closely. The ability of heat transfer between the protrusion 114 and the heat generation member 130 can be improved.

A manner in which the elastic member 118 is used to maintain the contact between the protrusion 114 and the heat generation member 130 via the deformation force is not limited herein. For example, the heat generation member 130 is connected to the first plate body 112 via the elastic member 118, such that the elastic member 118 can maintain the contact between the protrusion 114 and the heat generation member 130 via the deformation force. As another example, a fixing structure for fixing the heat generation member 130 can be connected to the first plate body 112 via the elastic member 118, such that the elastic member 118 can maintain the contact between the protrusion 114 and the heat generation member 130 via the deformation force.

The structure of the elastic member 118 is not limited herein. For example, the elastic member may include a spring.

The first housing 110 may be formed by a plate body with other forms. As shown in FIGS. 4 and 5, the first housing 110 has the protrusion 114, i.e., the plate body on the side corresponding to the accommodation cavity 101 can have the protrusion 114.

In some embodiments, the electronic device may further include a fan assembly 150. The fan assembly 150 can be arranged in the accommodation cavity 101, and the fan assembly 150 can be configured to dissipate heat for the heat generation member 130. As such, not only the heat exchange liquid in the first flow channel 111 can dissipate heat for the electronic device, but also the fan assembly 150 can dissipate heat for the electronic device.

In some embodiments, when the heat generated by the electronic device is small, the electronic device can be dissipated using one of the fan assembly 150 and the first flow channel 111. When the electronic device generates a large amount of heat, the fan assembly 150 and the first flow channel 111 can jointly dissipate heat for the electronic device, such that the electronic device can have various heat dissipation manners.

The structure of the fan assembly 150 is not limited herein. For example, the fan assembly 150 can include a fan and a radiator arranged in the accommodation cavity 101.

Consistent with the disclosure, the electronic device can include the first housing 110, the second housing 120 connected to the first housing 110, the accommodation cavity 101 formed between the first housing 110 and the second housing 120, the heat generation member 130 arranged in the accommodation cavity 101, and the first flow channel 111 arranged in the first housing 110. The first flow channel 111 can be configured to accommodate the heat exchange liquid, and dissipate heat for the heat generation member 130 through the flowing heat exchange liquid. Since the first flow channel 111 is arranged in the first housing 110, the heat dissipation structure of the electronic device can be greatly reduced. The first housing 110 can serve as both the housing of the electronic device and the heat dissipation structure of the electronic device, which can greatly reduce the structure of the electronic device. Since the first housing 110 is the housing of the electronic device, the plurality of first flow channels 111 can be arranged in the first housing 110, thereby greatly increasing the volume of the first flow channel 111.

The scope of the disclosure is not limited to the embodiments described above. Other alternations, modifications, or equivalents to the disclosed embodiments that are easily conceived by a person skilled in the art are intended to be encompassed within the scope of the present disclosure. The protection scope of the present disclosure is subject to the protection scope of the claims.

What is claimed is:

1. An electronic device comprising:
   a first housing including a first plate body and a second plate body;
   a second housing connected to the first housing, an accommodation cavity being formed between the first housing and the second housing;
   a heat generation member arranged in the accommodation cavity; and
   a flow channel arranged between the first plate body in contact with the heat generation member and the second plate body connected to the first plate body in the first housing and configured to accommodate heat exchange liquid and dissipate heat for the heat generation member through the heat exchange liquid;
   wherein:
   the second plate body has a straight plate structure, is located at an outer side of the electronic device, and has a low thermal conductivity that reduces the heat dissipated through the heat exchange liquid from being transferred to the outer side of the electronic device; and
   the first plate body has a thermal conductivity greater than that of the second plate body and transfers the heat from the heat generation member to the heat exchange liquid, and includes:
   a first portion having a straight plate structure, the first portion being spaced apart from the second plate body by the flow channel; and
   a second portion extending from an edge of the first portion and being perpendicular to the first portion, the first portion and the second portion forming an integral structure, and the second portion enclosing the second plate body and being connected to an edge of the second plate body with no gap therebetween.

2. The electronic device according to claim 1, wherein:
   the first plate body and the second plate body form an integral structure; and
   a connection portion between the first plate body and the second plate body extends from the flow channel to an outer surface of the first housing.

3. The electronic device according to claim 1, wherein:
   the first plate body includes a protrusion arranged in the accommodation cavity and in thermally conductive contact with the heat generation member.

4. The electronic device according to claim 3,
   wherein the flow channel is a first flow channel; and
   the electronic device further comprising:
   a second flow channel in the protrusion and communicating with the first flow channel.

5. The electronic device to claim 3,
   wherein the protrusion is connected to the first plate body; and
   the electronic device further comprising:
   an elastic member arranged between the heat generation member and the first plate body, and configured to maintain a contact between the protrusion and the heat generation member via a deformation force.

6. The electronic device according to claim 1, further comprising: a driver mechanism communicating with the inlet and the outlet, and configured to drive the heat exchange liquid to flow in the flow channel.

7. The electronic device according to claim 6, wherein the driver mechanism includes a pump body.

8. The electronic device according to claim 1, wherein the first housing includes an inlet and an outlet communicating with the flow channel and arranged at an outer surface of the first housing.

9. The electronic device according to claim 1, wherein the first housing is configured to abut against a bearing surface to support the electronic device.

10. The electronic device according to claim 1, further comprising:
    a fan assembly arranged in the accommodation cavity and configured to dissipate heat for the heat generation member.

11. The electronic device according to claim 1, wherein:
a protrusion is provided on the first plate body and arranged in the accommodation cavity and in thermally conductive contact with the heat generation member; and
the protrusion and the first plate body are two different structure members.

12. The electronic device according to claim 1, wherein:
the first plate body and the heat generation member are connected by a thermally conductive adhesive.

13. The electronic device according to claim 1, wherein:
a size of a contact area of the second plate body with the heat exchange liquid is substantially the same as a size of a contact area of the first plate body with the heat exchange liquid.

* * * * *